(12) United States Patent
Guthrie et al.

(10) Patent No.: US 10,574,253 B1
(45) Date of Patent: Feb. 25, 2020

(54) LOW POWER ADC SAMPLING IN A DIGITAL POWER CONTROLLER

(71) Applicant: Renesas Electronics America Inc., Milpitas, CA (US)

(72) Inventors: Travis Guthrie, Austin, TX (US); Narendra Kayathi, Austin, TX (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 16/358,512

(22) Filed: Mar. 19, 2019

Related U.S. Application Data (60) Provisional application No. 62/645,649, filed on Mar. 20, 2018.

(51) Int. Cl.
*H03M 1/12* (2006.01)
*G01R 15/18* (2006.01)
*G01R 19/25* (2006.01)

(52) U.S. Cl.
CPC ............ *H03M 1/126* (2013.01); *G01R 15/18* (2013.01); *G01R 19/2513* (2013.01)

(58) Field of Classification Search
CPC ..... H03M 1/126; H03M 1/1265; H03M 1/127
USPC ................. 341/122, 155, 159, 144, 150
See application file for complete search history.

(56) References Cited

U.S. PATENT DOCUMENTS

| | | | | |
|---|---|---|---|---|
| 5,581,254 A | * | 12/1996 | Rundel | G05B 19/19 318/811 |
| 9,419,642 B1 | * | 8/2016 | Nguyen | H03M 3/42 |
| 9,977,057 B2 | | 5/2018 | Guthrie et al. | |
| 2007/0080844 A1 | * | 4/2007 | Terazawa | H03M 1/0636 341/155 |

* cited by examiner

*Primary Examiner* — Peguy Jean Pierre
(74) *Attorney, Agent, or Firm* — Foley & Lardner LLP (57) ABSTRACT

According to certain aspects, the present embodiments provide a solution for sampling and converting an analog signal at high frequencies but with low power consumption. In some embodiments, a low power, low resolution, AC coupled ADC is used to track the high frequency component of the analog input signal, in parallel with a high resolution ADC to sense the DC signal at a significantly lower sample rate. According to some aspects, the AC coupled ADC requires no reference or a low resolution reference. In these and other embodiments, a plurality of low resolution, low power ADCs having a high sampling rate may be time multiplexed together with a precision ADC at a low sampling rate.

20 Claims, 7 Drawing Sheets

LOW POWER ADC SAMPLING IN A DIGITAL POWER CONTROLLER

CROSS-REFERENCE TO RELATED APPLICATIONS

The present application claims priority to U.S. Provisional Application No. 62/645,649 filed Mar. 20, 2018, the contents of which are incorporated by reference herein in their entirety.

TECHNICAL FIELD

The present embodiments relate generally to digital power management, and more particularly to analog-to-digital conversion (ADC) sampling of various signal values in a digital power controller.

BACKGROUND

Conventional digital power management products sample the signals used in the power management process in various ways. For example, a digital voltage regulator using a negative-feedback control loop may generate an analog reference signal with a digital-to-analog converter (DAC). This analog voltage reference can then be subtracted from a regulator output voltage and sent to a high sample rate error ADC. Alternatively, digital systems may sample and convert signals using a high resolution ADC directly without the need for comparison to a DAC reference. One problem with these systems is that the power consumed by these components is high, particularly when voltage references are needed to ensure that ADC samples are not corrupted by power supply noise (i.e. to maintain a low PSRR). In addition, in systems where many ADC's are required—for instance, in power management ICs with several regulated output voltages—these approaches simply duplicate this relatively expensive (with respect to power consumption and area) hardware for each ADC in the system. Accordingly, a solution is needed for these and other problems.

SUMMARY

According to certain aspects, the present embodiments provide a solution for sampling and converting an analog signal at high frequencies but with low power consumption. In some embodiments, a low power, low resolution, AC coupled ADC is used to track the high frequency component of the analog input signal, in parallel with a high resolution ADC to sense the DC signal at a significantly lower sample rate. According to some aspects, the AC coupled ADC requires no reference or a low resolution reference. In these and other embodiments, a plurality of low resolution, low power ADCs having a high sampling rate may be time multiplexed together with a precision ADC at a low sampling rate.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments allow for a low power, low resolution, AC coupled ADC to track the high frequency component of an analog input signal, coupled with a precision ADC to sense the DC component of the analog input signal at a significantly lower sample rate. The present embodiments can find useful application in a digital power management controller, for example.

By way of background, DC-to-DC voltage conversion is often performed by switching voltage regulators, or step-down regulators, also referred to as voltage converters, point-of-load regulators, or power converters, converting an input voltage to a regulated output voltage as required by one or more load devices. More generally, voltage regulators and current regulators are commonly referred to as power converters, and as used herein, the term power converter is meant to encompass all such devices. Switching voltage regulators often use two or more power transistors to convert energy at one voltage to another voltage. One common example of such a voltage regulator, commonly called a buck regulator or buck controller operates to convert an input voltage (e.g. from an adapter, a power line, battery, etc.) to a lower regulated voltage. It should be noted that the principles of the present embodiments can also be practiced in other types of regulators such as buck-boost and boost regulators. Voltage regulators are sometimes implemented using a current share configuration (i.e. multiphase) in which power is distributed through shared voltage supplies.

Figure 1:
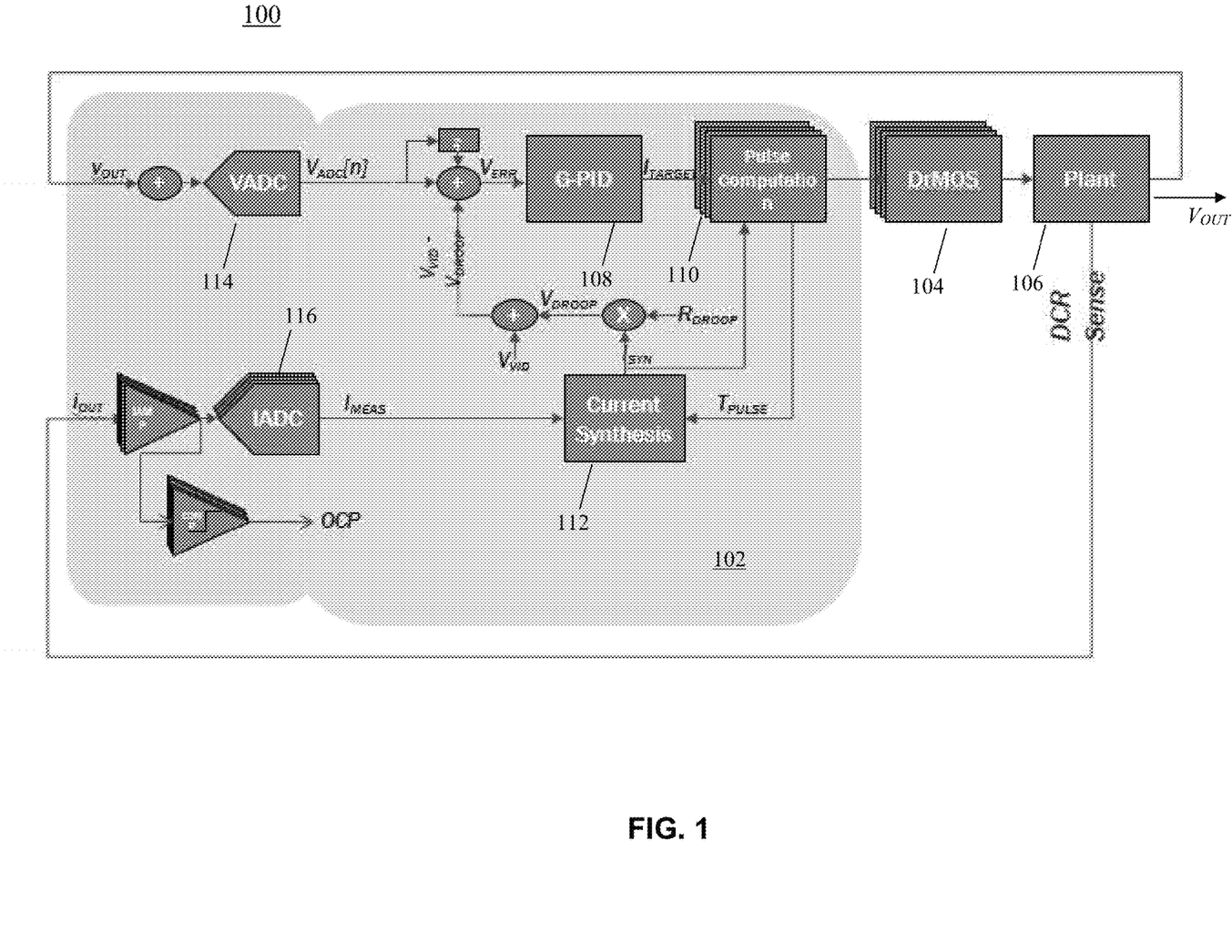
FIG. 1 is a block diagram of an example digital power controller for illustrating aspects of the embodiments.

A block diagram illustrating aspects of an example voltage regulator having a current share configuration is shown in FIG. 1. As shown, voltage regulator 100 includes a control stage 102 and an output stage 104. Plant 106 can comprise an output filter such as an inductor and capacitor and provide an output voltage $V_{OUT}$ to a load (not shown). Control stage 102 includes generally includes a G-PID block 108 and a pulse computation block 110, and can be implemented in many ways known to those skilled in the art. In operation, these blocks use voltage and current (e.g. DCR sense) feedbacks from plant 106, as well as synthesized current information from current synthesizer 112 to produce PWM signals that are output by block 110 to output stage 104 (e.g. output drivers and power MOSFETs) so as to provide a regulated voltage $V_{OUT}$ to a load coupled to plant 106. In this example, output stage 104 includes four phases (e.g. drivers, FET pairs).

As further shown, voltage regulator 100 includes a voltage sense ADC 114 and current sense ADCs 116. Voltage sense ADC 114 is a high bandwidth ADC used to regulate the output voltage. Current sense ADCs 116 (one for each phase, or four in this example) are required to convert high bandwidth current sense information for use by current synthesizer 112, and used by blocks 108 and 110. Voltage regulator 100 can further include a telemetry ADC (not shown) that is used to sample many other analog signals in the system with a high level of accuracy.

According to some aspects, the present applicant recognizes several inefficiencies in conventional digital power management systems such as that shown in FIG. 1. For example, in connection with the analog voltage sense feedback signal, an analog reference signal is generated with a DAC which is then subtracted from the incoming signal and sent to a high sample rate error ADC. Many systems also directly sample and convert the analog current sense inputs using high resolution ADCs directly. The problem with these solutions tends to be the power associated with the components, especially the power consumed by accurate references for the ADCs that are required to keep the PSRR high, in combination with the high sample rates that are typically required. In addition, in systems where many rails/ADC's are required, these solutions simply duplicate the relatively expensive (with respect to power and area) hardware for each rail/ADC.

Figure 2:
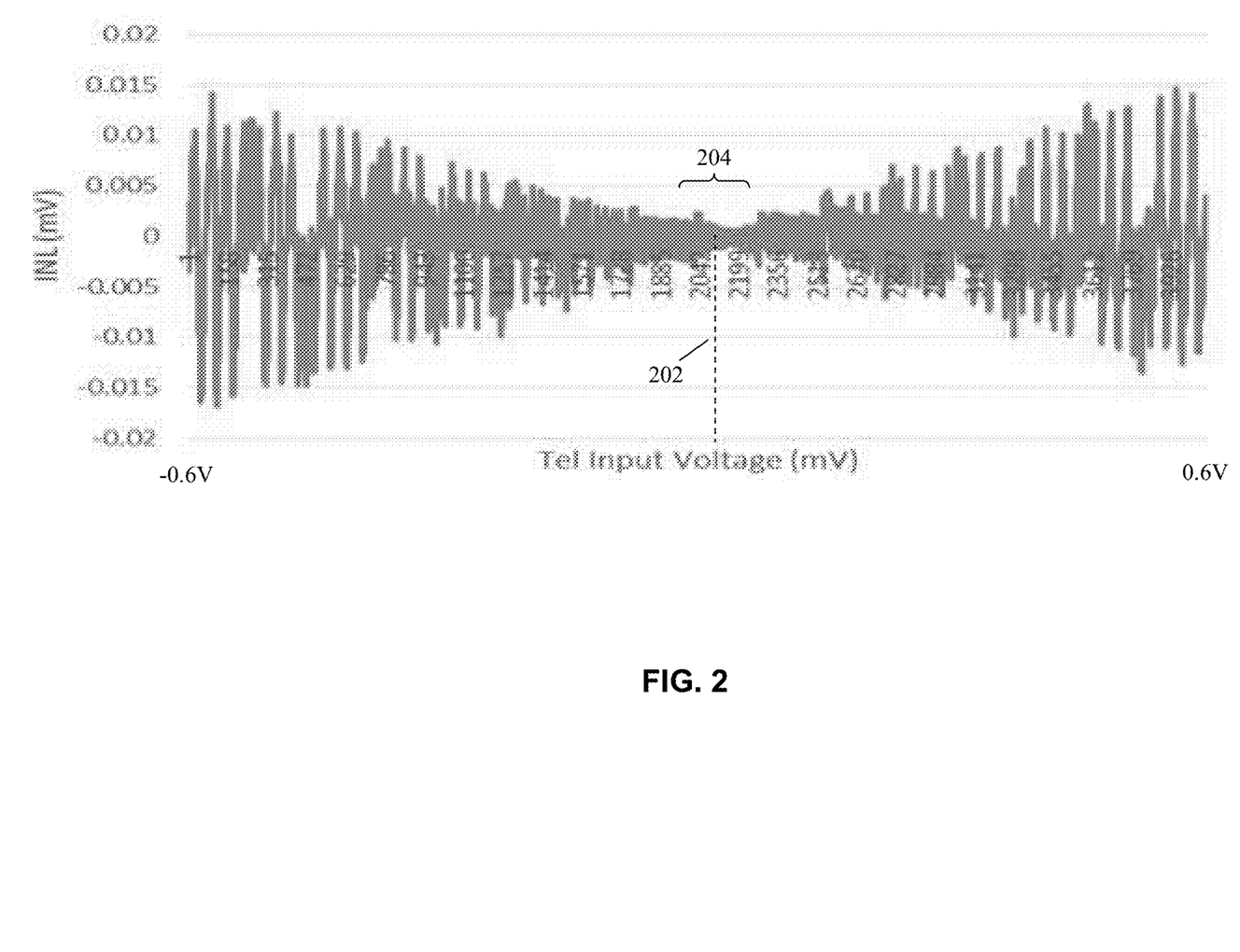
FIG. 2 is a waveform diagram illustrating example aspects of ADC sampling according to embodiments.

According to certain aspects, the present applicant recognizes that low PSRR ADC sampling can be obtained even with low power solutions. FIG. 2 is a waveform diagram illustrating aspects of ADC sampling using a power supply as a reference, and AC coupling the ADC as will be described in more detail below. In the example of FIG. 2, a 12-bit ADC (i.e. 4096 codes) is being used to sample a signal with a dynamic range of +/−0.6V, centered around code 2048 (corresponding to 0V, line 202). The vertical axis represents the corruption of the sample for each code due to power supply noise. As can be seen, for codes associated with the highest voltages (codes 0 and 4096 corresponding to +/−0.6V in this example) show the most corruption, while codes centered around 0V show the least. In this and similar examples, the present applicant has discovered that if the input to the ADC is kept below +/−10 mV (i.e. around 40 codes denoted by 204 centered around 202), the PSSR of the ADC will be >40 dB, which is sufficiently low for most applications.

According to certain additional aspects, therefore, the present embodiments leverage this discovery by using a low power, low resolution, AC coupled ADC operating at a high frequency for sampling an analog input signal, with mechanisms to ensure that input to the ADC is kept centered around a very low analog voltage. Meanwhile, a high resolution ADC operating at a lower sampling frequency can track the DC component of the analog input signal.

Figure 3:
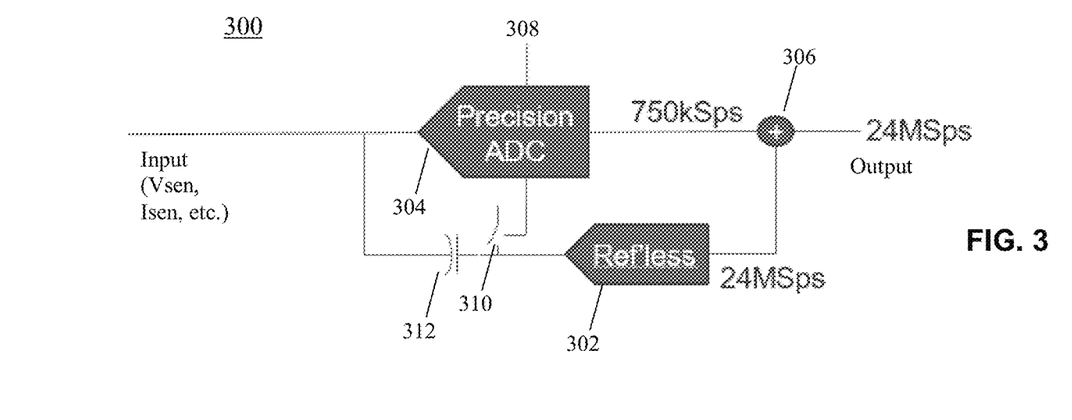
FIG. 3 is a functional block diagram illustrating an example low power ADC sampling solution according to embodiments.

FIG. 3 is a functional block diagram illustrating an example low power ADC sampling solution 300 according to embodiments. According to certain general aspects shown in FIG. 3, the present embodiments use a reference-less ADC 302 in parallel with a precision ADC 304 running at a lower sample rate. More particularly, as shown, the reference-less ADC 302 runs at the required rail sample rate (e.g. 8 MHz-64 MHz), or more particularly 24 MHz in this example. The precision ADC 304 is used to acquire low frequency levels (e.g. 750 kHz in this example) of the input. The summed result from 306 is used as the digital output voltage at the required overall sampling rate of 24 MHz. As further shown, the input is coupled to the reference-less ADC 302 with capacitors (e.g. 312, for illustration) to the comparator in ADC 302 to implement AC coupling for high frequency sampling as will be described in more detail below. Moreover, ADC 302 is zeroed when DC accurate ADC samples are obtained by precision ADC 304. More particularly, in response to activation signal 308, precision ADC 304 obtains a sample of the input, and simultaneously switch 310 is closed to zero the ADC 302 (i.e. cause the ADC 302 to zero at the current output of ADC 304), thereby causing the low-frequency sample from ADC 304 to be provided on the output via 306 (e.g. a digital adder or combiner, possibly with functionality to account for different precisions or numbers of bits between the outputs of ADC 302 and ADC 304).

As will become more apparent below, the present embodiments such as solution 300 allows for a lower power design (e.g., lower power consumed by precision ADC 304 due to the lower sample rate in combination with the lower power consumed by the reference-less ADC 302 due to use of no reference or a low-precision reference. Moreover, according to certain additional aspects of the example of FIG. 3, the filtered average of the resulting reference-less ADC conversions sampled concurrently with the precision ADC conversions are subtracted from the reference-less ADC output. This ensures that any latency difference between the two ADC's are filtered out as well as providing an offset to correct for subsequent conversions by the reference-less ADC. In addition, in some embodiments, the reference-less ADC is not a sample and hold ADC. Rather it is always connected to the input allowing for lower latency to some degree. But similar benefits could be obtained by sample/hold. Still further, the example solution 300 according to the embodiments increases the input impedance of the overall converter by the ratio of the reference-less ADC sample rate to the precision ADC sample rate. Given that the input impedance of the reference-less ADC is very high, this decreases the dependency of the input impedance of the overall solution 300 on the sample rate of the precision ADC.

Figure 4:
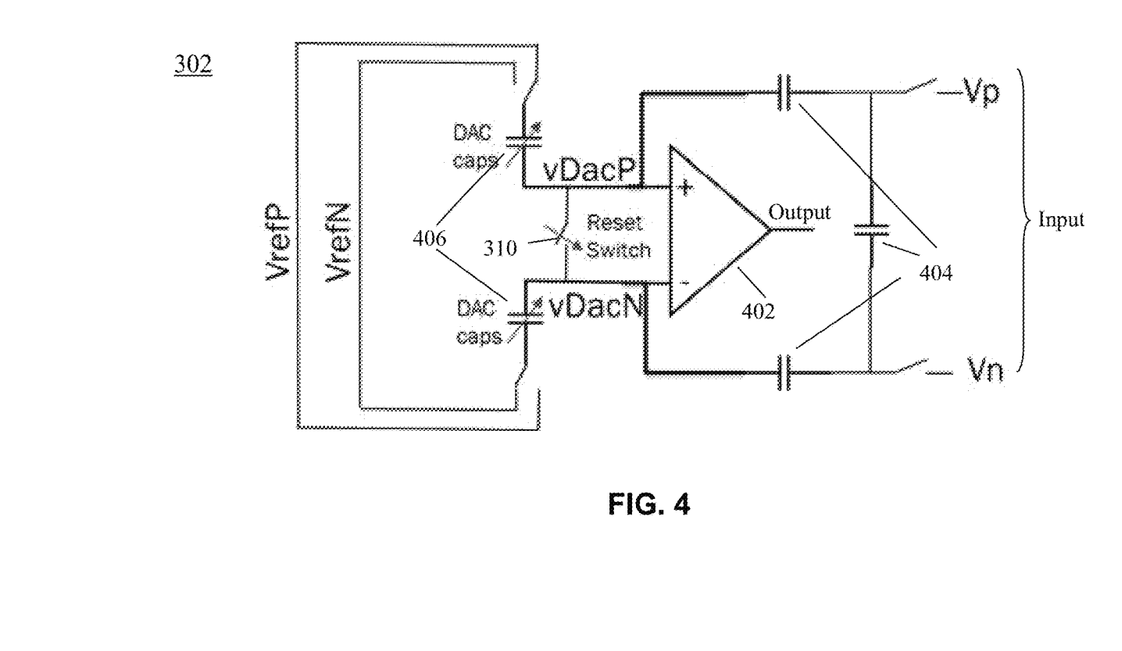
FIG. 4 is a functional block diagram illustrating an example AC coupled ADC for use in an ADC sampling solution according to embodiments.

FIG. 4 is a functional block diagram illustrating an example reference-less ADC that can be used to implement FIG. 3 in more detail.

In general, in this example, and in contrast with precision ADC 304, the differential inputs (—Vp and —Vn) to the reference-less ADC 302 are AC coupled by means of capacitors 404 arranged between the differential inputs and the inputs to the ADC comparator 402. Capacitor DACs 406 are used to measure the change in the input since the last time the input was sampled with the precision ADC 304 by activation of switch 310 (i.e. cause the ADC 302 to zero the center code at the sample value provided by ADC 304). In systems where the input is single sided (i.e. Vp moves, but Vn is mostly fixed), only the capacitor DACs 406 on the negative side are adjusted to compensate for comparator 402 offset. Otherwise, the main purpose of the capacitor DAC 406 on the negative side is to subtract differential reference noise. It should be noted that many of the advantages of this circuit can also be achieved with a simple single-ended ADC. According to certain aspects to be described herein below, and in further contrast to precision ADC 304, the ADC references VrefP and VrefN of ADC 302 can be connected to low-precision reference voltages, or no references at all.

More particularly, Table 1 below illustrates example values of various signals in the AC ADC shown in FIG. 4 depending on the input to the ADC 302. In one example, the values of the variables in Table 1 are ADC gain G=0.5 and dynamic range of the input FS=+/−0.6V. However, the present embodiments are not limited to this example.

TABLE 1

| ADC input | vDacP-vDacN | vDacP connections | vDacN connections |
|---|---|---|---|
| +FS | (VrefP-VrefN) * G | All VrefP | All VrefN |
| −FS | (VrefN-VrefP) * G | All VrefN | All VrefP |
| 0 V | (0.5 * VrefP + 0.5 VrefN) − (0.5 * VrefP + 0.5 VrefN) * G | 50% VrefP/ 50% VrefN | 50% VrefP/ 50% VrefN |

In one example implementation of FIG. 4, VrefP is connected to the power supply Vdd (e.g. 1.2V) and VrefN is connected to ground (e.g. 0V). However, as can be seen, when the input is 0V, the references VrefP and VrefN subtract out completely (i.e. the ADC is made reference-less). Moreover, an advantage of AC coupling the input for normal/high frequency operation as shown in FIG. 3 is that when the input signal being converted is very close to 0 as described above in connection with FIG. 2, a very high PSSR can be achieved even with a reference having a very low overall PSSR, due to the fact that both inputs to the differential comparator would be derived from dividers from the reference. This allows for the use of an extremely low power reference, in contrast to the reference required by a precision ADC such as ADC 304 in FIG. 3. In addition, only the small signal portion of the input waveform must be converted, ensuring the calculations required at high frequencies are minimized.

Figure 5:
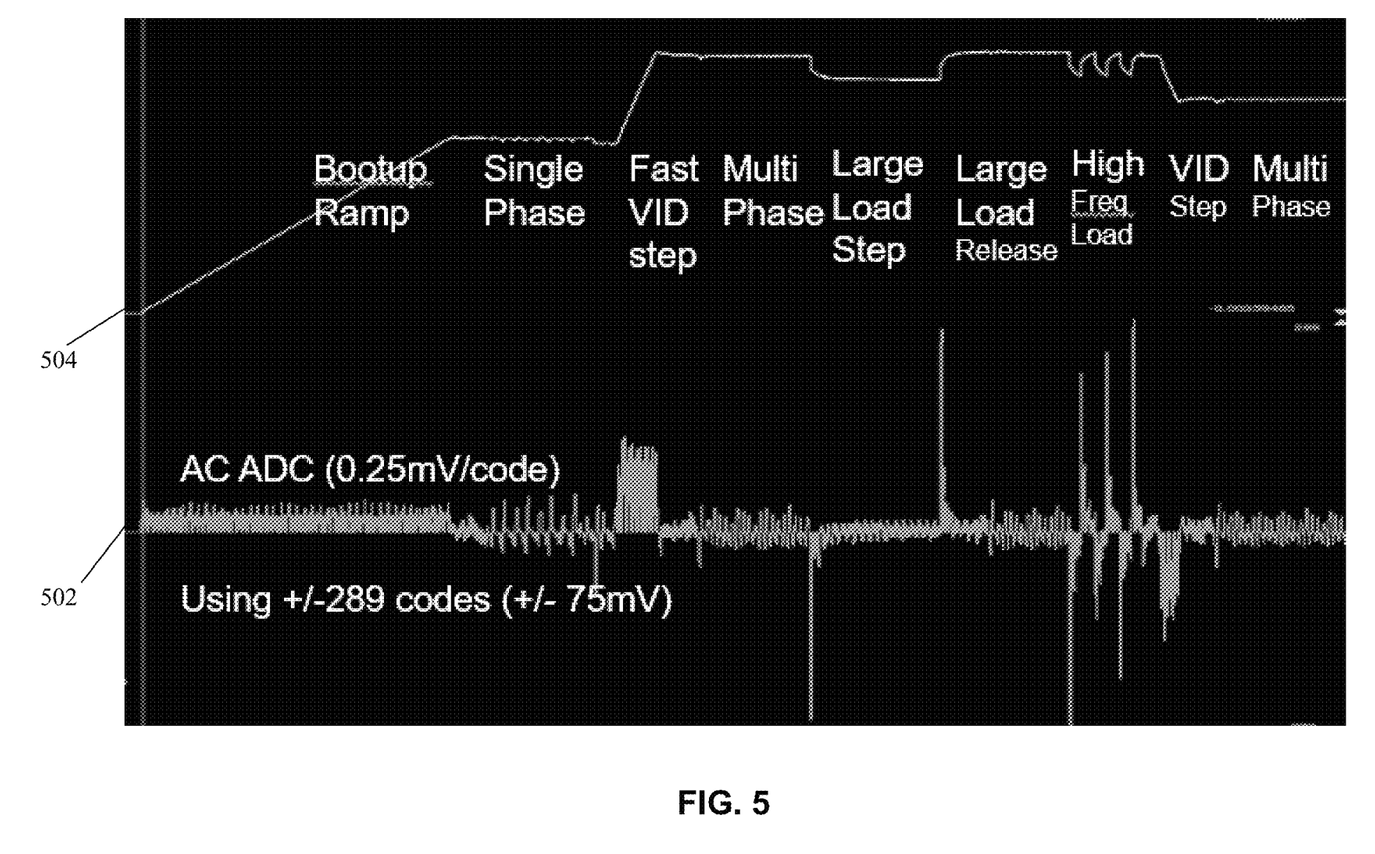
FIG. 5 is a waveform diagram illustrating example aspects of an ADC solution according to embodiments.

FIG. 5 provides waveform diagrams illustrating example aspects of the approach of the present embodiments. More particularly, waveform 502 represents an example output of reference-less ADC 302 and waveform 504 represents an example output of precision ADC 304 in a variety of conditions during their use to sense an output voltage (e.g. $V_{OUT}$) in operation of a multiphase voltage controller such as that shown in FIG. 1. It should be noted that the voltage scales (i.e. the values along the vertical axis) for waveforms 502 and 504 are different, with the values for waveform 502 being on the order of millivolts and the values for waveform 504 being on the order of volts. However, the time domain values (the horizontal axis) are the same, and are intended to show the concurrent values for each waveform during various operating conditions.

In this example, the reference-less ADC 302 is implemented with a 12-bit ADC, wherein 0.25 mV/code corresponds to a dynamic range of +/−0.6V. Moreover in this example, the DC sampling by ADC 304 is performed at 780 kHz, and the AC sampling by ADC 302 is performed at 24 MHz (and zeroed at 780 kHz).

As shown in the example of FIG. 5, during large transient conditions, such as during a large load step, a large load release and a high frequency load shown by waveform 504, the waveform 502 briefly demonstrates very large changes. More particularly, during these transients, the output of ADC 302 can very briefly have values approaching +/−289 codes, which corresponds to about 75 mV. Accordingly, during these largest transients, the solution 300 has only about 20 dB PSSR. Otherwise, as can also be seen (e.g. during bootup ramp, single phase operation, fast VID step, etc. shown by waveform 504), the output of ADC 302 represented by waveform 502 has relatively low values (e.g. less than about 10 mV), and so in steady state conditions, the solution 300 has a PSSR greater than 40 dB.

Figure 6:
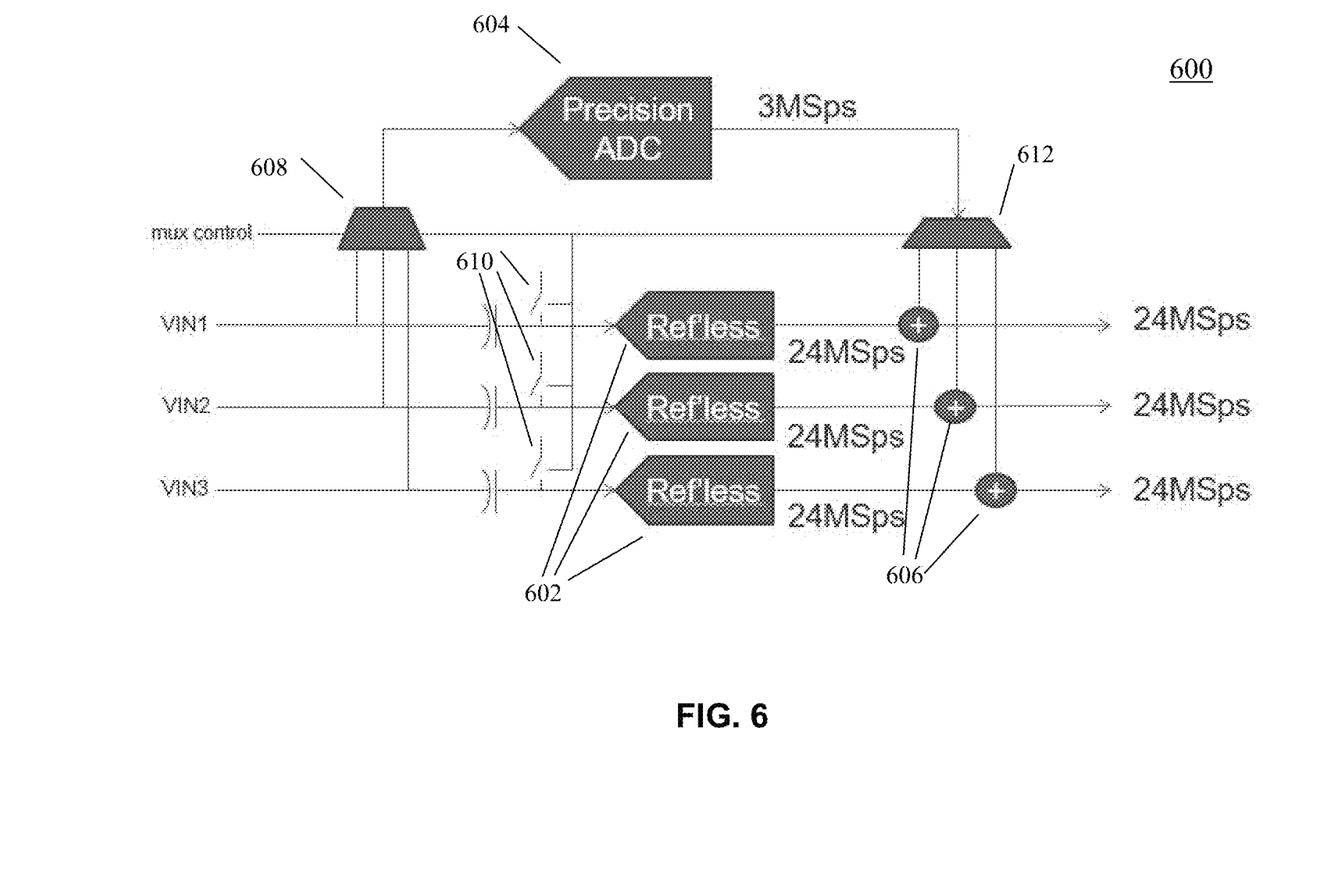
FIG. 6 is a functional block diagram illustrating an example shared ADC sampling solution according to embodiments.

FIG. 6 is a functional block diagram illustrating a time-shared ADC according to additional or alternative embodiments.

More particularly, another aspect of the present embodiments involves the use of a common/shared precision ADC to sample the DC portion of a plurality of different input signals in parallel with several corresponding reference-less ADCs. For example, FIG. 6 illustrates a sampling solution 600 for low power sampling of three input signals VIN1, VIN2 and VIN3. In this example, three reference-less ADCs 602 respectively sample the three input signals at a 24 MHz sampling rate and provide their outputs to respective summers 606. Meanwhile, a precision ADC 604 operates at a sampling rate of 3 MHz to sequentially sample the three input signals at a rate of 1 MHz each by operation of mux 608, and to concurrently zero the corresponding reference-less ADCs 602 via switches 610 as described above. As further shown, a separate mux 610 is controlled simultaneously with mux 610 to provide the output of precision ADC 604 to the respective summer 606 (e.g., a digital adder or combiner similar to 306, receiving outputs perhaps via a respective latch that is reset with the low frequency output of precision ADC 604).

Figure 7:
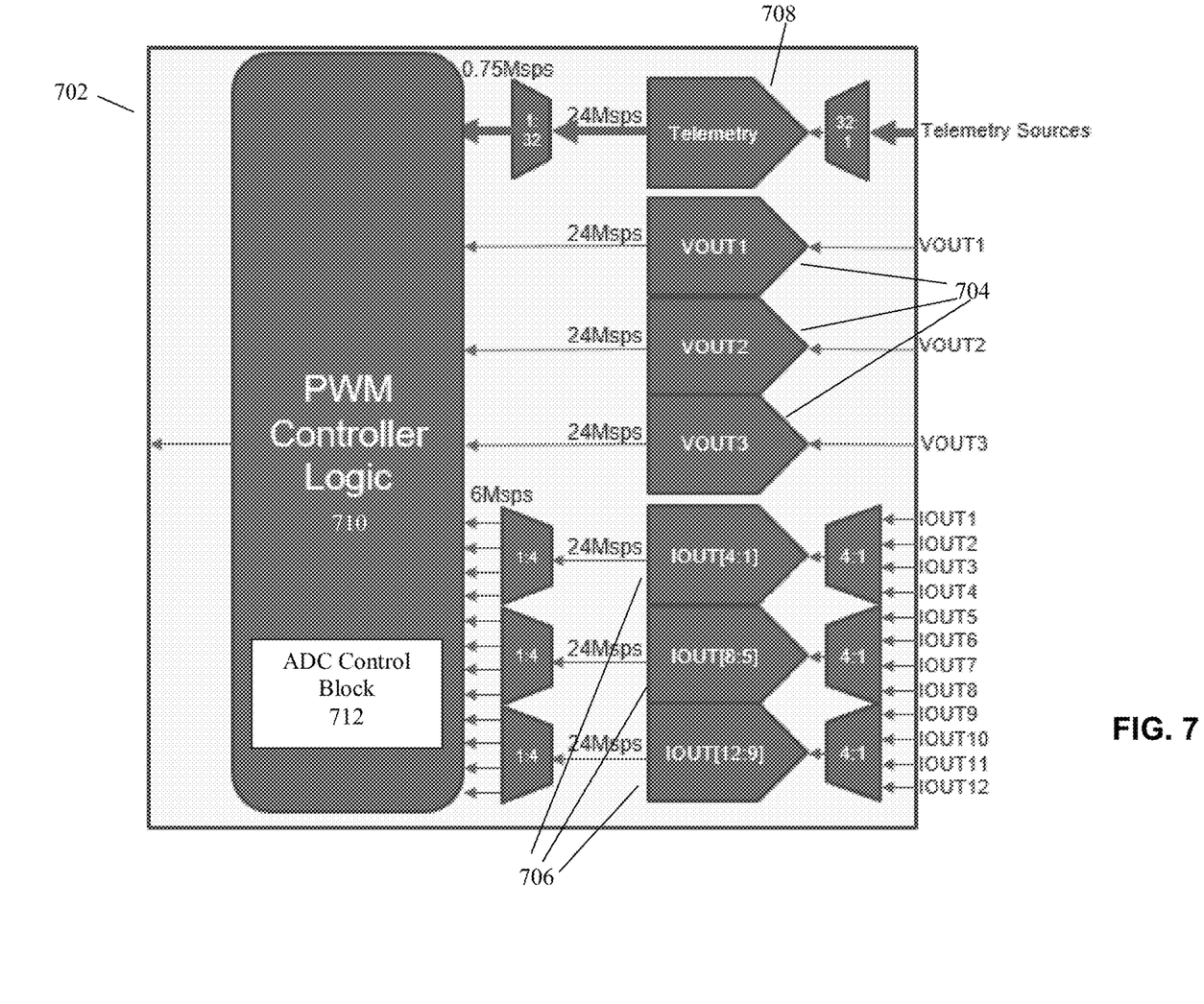
FIG. 7 is a block diagram illustrating an example controller incorporating a low power ADC sampling solution according to embodiments.

FIG. 7 is a block diagram illustrating an example of how a solution such as that shown in FIG. 6 can be implemented in a digital power controller.

More particularly, FIG. 7 shows an example controller 702 for a twelve-phase voltage regulator having three control loops. Accordingly, controller 702 receives twelve current sense signals IOUT1 to IOUT12, one for each phase, and three analog voltage sense signals VOUT1 to VOUT3, one for each loop. These signals are provided to three respective voltage sense ADCs 704, and three current sense ADCs 706, with analog current sense signals from four phases multiplexed for each of the three current sense ADCs 706. As further shown, controller 702 further includes a telemetry ADC 708 that senses signals from 32 telemetry sources via a separate input multiplexer. The signals from all of the ADCs 704, 706, 708 are provided to PWM controller logic 710, which uses them to provide appropriate PWM modulator signals for each of the twelve phases. As shown, each of the ADCs 704, 706, 708 operates at a 24 MHz sampling rate.

To incorporate the solutions of the present embodiments, controller 702 can be adapted to use the telemetry ADC 708 as a precision ADC. As shown in FIG. 7, this ADC already exists in the design and must be DC accurate. However, similar advantages can be had by even having a slower DC accurate ADC in parallel with each AC coupled ADC. In any event, to implement the solutions of the present embodiments, telemetry ADC 708 can be coupled in parallel with any or all of ADC's 704 and 706 as shown in FIGS. 3 and 6, along with corresponding multiplexers. These multiplexers and activation signals can be generated by an ADC control block 712 that may be incorporated into PWM controller logic 710. Those skilled in the art would understand how to implement such a control block after being taught by the present examples.

In such an adapted system, the DC ADC sampling by ADC 708 may be synchronous or asynchronous to the PWM signals since in a single phase situation, the output voltage signal tends to move the least shortly after the PWM high pulse. But in multiphase, better resolution may be found by walking the DC coupled ADC across the PWM with a frequency asynchronous to the PWM to ensure no aliasing occurs.

Figure 8:
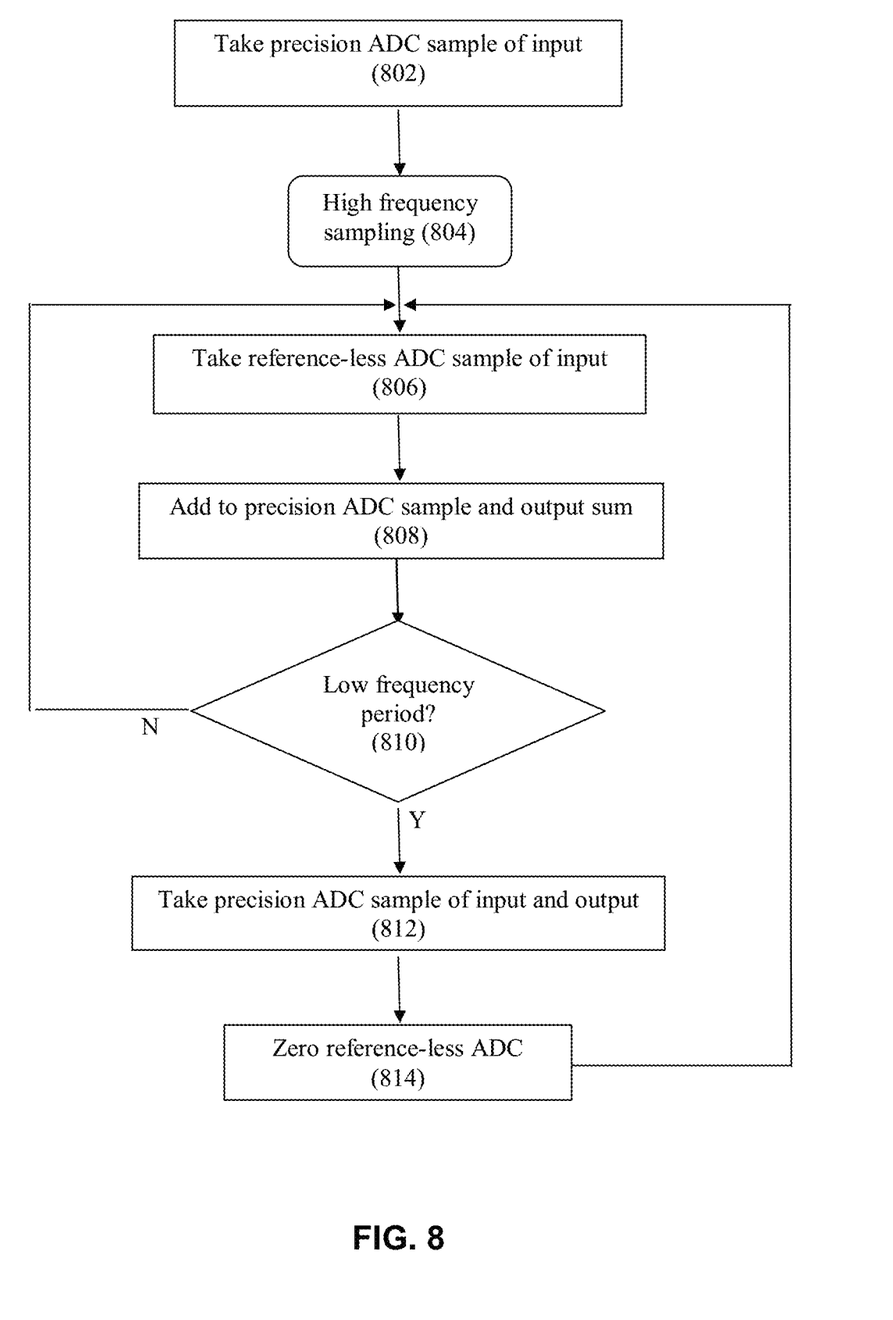
FIG. 8 is a flowchart illustrating an example ADC sampling methodology according to embodiments.

FIG. 8 is a flowchart illustrating an example methodology according to embodiments.

As shown, in block 802, the analog input signal (e.g. a voltage sense signal or a current sense signal) is sampled using the precision ADC (e.g. 304) and this sampled value is used to zero the reference-less ADC (e.g. 302). The sampled value from the precision ADC is then provided as the converted output of the analog input signal.

In block 804, high frequency sampling is performed (e.g. at 24 MHz) and, for each high frequency sample, the functions in blocks 806 and 808 are performed. For example, in block 806 the input signal is sampled by the reference-less ADC (e.g. 302) and in block 808, the current output of the reference-less ADC is added to the last value from the precision ADC (e.g. 304), and the sum is provided as the current converted output of the analog input signal.

In block 812 it is determined whether low frequency processing is to be performed (e.g. at the lower sampling rate such as 750 kHZ). If not, processing returns to blocks 806 and 808. Otherwise processing branches to blocks 812 and 814. For example, in block 814 the analog input signal is sampled by the precision ADC (e.g. 304) and the sampled value from the precision ADC is provided as the converted output of the input signal. In block 816, the sampled value from the precision ADC (e.g. 304) is used to zero the reference-less ADC (e.g. 302) and processing returns to high frequency sampling in blocks 806 and 808.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. An apparatus for sampling signals in a power controller, comprising:
   a precision analog-to-digital converter (ADC) configured to sample an input signal at a first sample rate, the input signal being associated with a sense signal from an output stage in the power controller;
   a reference-less ADC configured to sample the input signal at a second higher sample rate, the reference-less ADC being zeroed with an output of the precision ADC at the first sample rate; and
   a summer that combines the outputs of the precision ADC and the reference-less ADC to produce a measured value of the sense signal at the second sample rate.

2. The apparatus of claim 1, wherein the reference-less ADC is AC coupled to the input signal.

3. The apparatus of claim 1, wherein the reference-less ADC comprises one or more capacitors that are reset with the output of the precision ADC at the first sample rate to as to zero the reference-less ADC.

4. The apparatus of claim 1, wherein the reference-less ADC has a precision that is lower than the precision ADC.

5. The apparatus of claim 1, wherein the reference-less ADC uses a power supply voltage as a reference.

6. The apparatus of claim 1, wherein the sense signal comprises an inductor current sense signal.

7. The apparatus of claim 1, wherein the sense signal comprises an output voltage sense signal.

8. An apparatus for sampling signals in a power controller, comprising:
   a precision analog-to-digital converter (ADC) configured to sample a plurality of input signals, each at a first sample rate;
   a plurality of reference-less ADCs, each reference-less ADC being configured to sample a respective one of the input signals at a second higher sample rate, each reference-less ADC being zeroed with an output of the precision ADC at the first sample rate; and
   a plurality of summers that combine the outputs of the precision ADC and the reference-less ADC to produce measured values of the plurality of input signals at the second sample rate.

9. The apparatus of claim 8, wherein each of the reference-less ADCs is AC coupled to the input signal.

10. The apparatus of claim 8, wherein each of the reference-less ADCs comprises one or more capacitors that are reset with the output of the precision ADC at the first sample rate to as to zero the reference-less ADC.

11. The apparatus of claim 8, wherein each of the reference-less ADCs has a precision that is lower than the precision ADC.

12. The apparatus of claim 8, wherein each of the reference-less ADCs uses a power supply voltage as a reference.

13. The apparatus of claim 8, wherein the precision ADC is a telemetry ADC for the power controller.

14. A method for sampling signals in a power controller, comprising:
   sampling an input signal with a precision analog-to-digital converter (ADC) at a first sample rate, the input signal being associated with a sense signal from an output stage in the power controller;
   sampling the input signal with a reference-less ADC at a second higher sample rate;
   zeroing the reference-less ADC with an output of the precision ADC at the first sample rate; and
   combining the outputs of the precision ADC and the reference-less ADC to produce a measured value of the sense signal at the second sample rate.

15. The method of claim 14, wherein the reference-less ADC is AC coupled to the input signal.

16. The method of claim 14, wherein the reference-less ADC comprises one or more capacitors that are reset with the output of the precision ADC at the first sample rate to as to zero the reference-less ADC.

17. The method of claim 14, wherein the reference-less ADC has a precision that is lower than the precision ADC.

18. The method of claim 14, wherein the reference-less ADC uses a power supply voltage as a reference.

19. The method of claim 14, wherein the sense signal comprises an inductor current sense signal.

20. The method of claim 14, wherein the sense signal comprises an output voltage sense signal.

* * * * *